US006737930B2

(12) United States Patent
Toncich

(10) Patent No.: US 6,737,930 B2
(45) Date of Patent: May 18, 2004

(54) TUNABLE PLANAR CAPACITOR

(75) Inventor: Stan Toncich, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 0 days.

(21) Appl. No.: 10/044,522

(22) Filed: Jan. 11, 2002

(65) Prior Publication Data

US 2002/0149444 A1 Oct. 17, 2002

Related U.S. Application Data

(60) Provisional application No. 60/283,093, filed on Apr. 11, 2001.

(51) Int. Cl.[7] ................................................. H01G 7/06
(52) U.S. Cl. .................. 333/24 C; 257/595; 361/306.3; 361/321.1
(58) Field of Search ................................ 361/281, 434, 361/321.1; 257/595; 333/24 C

(56) References Cited

U.S. PATENT DOCUMENTS

| 3,413,543 A | | 11/1968 | Schubring et al. | |
|---|---|---|---|---|
| 3,569,795 A | * | 3/1971 | Gikow | ........................ 361/434 |
| 3,676,803 A | | 7/1972 | Simmons | |
| 3,678,305 A | | 7/1972 | George | |
| 3,836,874 A | | 9/1974 | Maeda et al. | |

(List continued on next page.)

FOREIGN PATENT DOCUMENTS

| DE | 40 36 866 A1 | 7/1991 |
|---|---|---|
| EP | 0 637 131 A1 | 2/1995 |
| EP | 0 638 953 A1 | 2/1995 |
| EP | 0 680 108 A1 | 11/1995 |
| EP | 0 795 922 A1 | 9/1997 |

(List continued on next page.)

OTHER PUBLICATIONS

A. Presser, "Varactor–Tunable, High–Q Microwave Filter," RCA Review, vol. 42, Dec. 1981, pp. 691–705.
C. Chang and T. Itoh, "Microwave Active Filters Based on Coupled Negative Resistance Method," IEEE Trans. on Microwave Theory and Techniques, vol. 38, No. 12, Dec. 1990, pp. 1879–1884.
P. Katzin, B. Bedard, and Y. Ayasli, "Narrow–Band MMIC Filters with Automatic Tuning and Q–Factor Control," 1993 IEEE MTT–S Int. Microwave Symp. Digest pp. 403–406.
B. Hopf, I. Wolff, and M. Guglielmi, "Coplanar MMIC Active Bandpass Filters Using Negative Resistance Circuits," 1994 IEEE MTT–S Symposium Digest, pp. 1183–1185.
U. Karacaoglu and I.D. Robertson, "High Selectivity Varactor–Tuned MMIC Bandpass Filter Using Lossless Active Resonators," 1994 IEEE MTT–Symposium Digest, pp. 1191–1194.
B. Nauta, "A CMOS Transconductance–C Filter Technique for Very High Frequencies," IEEE Journal of Solid–State Circuits, vol. 27, No. 2, Feb. 1992, pp. 142–153.
K. Fujita, H. Itoh, R. Yamamoto, "A 15.6 GHz Commercially Based 1/8 GaAs Dynnamic Presealer," 1989 IEEE GaAs IC Symposium, pp. 113–116.
J. Smuk, P. Katzin, "MMIC Phase Locked L–S Band Oscillators," 1994 IEEE GaAs Symposium Digest, pp. 27–29.

(List continued on next page.)

*Primary Examiner*—Robert Pascal
*Assistant Examiner*—Dean Takaoka

(57) ABSTRACT

A tunable capacitor that introduces significantly less loss, if any, costs less and is smaller than previously available. A bias electrode is coupled to a FE material. The capacitor electrodes are electro-magnetically coupled to the FE material, such that the capacitor electrodes and the bias electrode are not touching. Only non-conductive material is in the gap defined by the capacitor electrodes. The bias electrode is used to apply a variable DC voltage to the FE material. A capacitor electrode serves as a DC ground for producing a variable DC field between the bias electrode and the capacitor electrodes.

9 Claims, 2 Drawing Sheets

U.S. PATENT DOCUMENTS

| | | | |
|---|---|---|---|
| 3,918,012 A | 11/1975 | Peuzin | |
| 4,475,108 A | 10/1984 | Moser | |
| 4,733,328 A | 3/1988 | Blazej | |
| 4,799,066 A | 1/1989 | Deacon | |
| 4,835,499 A | 5/1989 | Pickett | |
| 5,166,857 A | 11/1992 | Avanic et al. | |
| 5,212,463 A | 5/1993 | Babbitt et al. | |
| 5,216,392 A | 6/1993 | Fraser | |
| 5,307,033 A | 4/1994 | Koscica et al. | |
| 5,427,988 A | 6/1995 | Sengupta et al. | |
| 5,450,092 A | 9/1995 | Das | |
| 5,472,935 A | 12/1995 | Yandrofski et al. | |
| 5,496,795 A | 3/1996 | Das | |
| 5,557,286 A | 9/1996 | Varadan et al. | |
| 5,561,407 A | 10/1996 | Koscica et al. | |
| 5,589,845 A | 12/1996 | Yandrofski | |
| 5,617,104 A | 4/1997 | Das | |
| 5,640,042 A | 6/1997 | Koscica et al. | |
| 5,729,239 A | 3/1998 | Rao | |
| 5,777,524 A | 7/1998 | Wojewoda et al. | |
| 5,778,308 A | 7/1998 | Sroka et al. | |
| 5,880,921 A | 3/1999 | Tham et al. | |
| 5,945,887 A | 8/1999 | Makino et al. | |
| 5,965,494 A * | 10/1999 | Terashima et al. | 505/210 |
| 5,973,567 A | 10/1999 | Heal et al. | |
| 5,973,568 A | 10/1999 | Shapiro et al. | |
| 5,987,314 A | 11/1999 | Saito | |
| 6,028,561 A | 2/2000 | Takei | |
| 6,049,726 A | 4/2000 | Gruenwald et al. | |
| 6,052,036 A | 4/2000 | Enstrom et al. | |
| 6,097,263 A | 8/2000 | Mueller et al. | |
| 6,160,524 A | 12/2000 | Wilber | |
| 6,198,441 B1 | 3/2001 | Okabe | |
| 6,292,143 B1 | 9/2001 | Romanofsky | |
| 6,333,719 B1 | 12/2001 | Varadan | |

FOREIGN PATENT DOCUMENTS

| | | | |
|---|---|---|---|
| EP | 0 843 374 A2 | 5/1998 | |
| EP | 0 881 700 A1 | 12/1998 | |
| EP | 0 909 024 A2 | 4/1999 | |
| EP | 1 043 741 A2 | 10/2000 | |
| JP | 63128618 A * | 6/1988 | H01G/7/06 |
| JP | 05182857 A * | 7/1993 | H01G/4/06 |
| JP | 29-05-00 2001338839 | 7/2001 | |
| WO | WO 94/13028 | 6/1994 | |
| WO | WO 00/28613 | 5/2000 | |
| WO | WO 00/35042 | 6/2000 | |
| WO | WO 00/62367 | 10/2000 | |
| WO | WO 00/79645 A1 | 12/2000 | |
| WO | WO 00/79648 A1 | 12/2000 | |

OTHER PUBLICATIONS

S. R. Chandler, I.C. Hunter, and J.G. Gardiner, "Active Varactor Tunable Bandpass Filter," IEEE Microwave and Guided Wave Letters, vol. 3, No. 3, Mar. 1993, pp. 70–71.

I.C. Hunter and John D. Rhodes, "Electronically Tunable Microwave Bandpass Filters," IEEE Trans. on MTT. vol. 30, No. 9, Sep. 1982, pp. 1354–1367.

S. Toyoda, "Quarter–wavelength Coupled Variable Bandstop and Bandpass Filters Using Varactor Diodes," IEEE Trans. on Mtt. vol. 30, No. 9, Sep. 1982, pp. 1387–1389.

B. Yu, Kapilevich, "Variety of Approaches to Designing Microwave Active Filters," Proc. 27th European Microwave Conf., Jerusalem, vol. 1, 1997, pp. 397–408.

B. Yu, Kapilevich, "Understand the Operation of Channelized Active Filters," Microwaves & RF. Jan. 1997, pp. 89–92.

M. Dishal, "Alignment and Adjustment of Synchronously Tuned Multiple Resonator–Circuit Filters" Proc. IRE 39, Nov. 1951, pp. 1448–1455.

S. B. Cohn, "Dissipation Loss in Multiple–Coupled–Resonator Filters," Proc. IRE 47, Aug. 1959, pp. 1342–1348.

G. L. Matthael, "An Electronically Tunable Up–Converter," Proc. IRE 49, Nov. 1961, pp. 1703–1704.

E. G. Fubini and E.A. Guillemin, "Minimum Insertion Loss Filters," Proc. IRE 47, Jan. 1959, pp. 37–41.

W.J. Getsinger, "Prototypes for Use in Broadbanding Reflection Amplifiers," IEEE Trans. PTGMTT–11, Nov. 1963, pp. 486–497.

E.S. Kuh and M. Fukada, "Optimum Synthesis of Wide–Band Parametric Amplifiers and Converters," IRE Trans. PCCT–8, Dec. 1961, pp. 410–415.

W. J. Getsinger and G.L. Matthaei, "Some Aspects of the Design of Wide–Band Up–Converters and Nondegenerate Parametric Amplifiers," IEEE Trans. PTGMTT–12, Jan. 1964, pp. 77–87.

R.L. Steven, "Design of a Tunable Multi–Cavity Waveguide Band–Pass Filter," 1959 IRE National Convention Record, Part 3, pp. 91–112.

J.J. Taub and B. F. Bogner, "Design of Three–Resonator Dissipative Band–Pass Filters Having Minimum Insertion Loss," Proc. IRE 45, pp. 681–687 (May 1957).

K.L. Kotzebue, "Broadband Electronically–Tunable Microwave Filters," 1960 IRE Wescon Convention Record, Part 1, pp. 21–27.

J.P. Louhos and I. Pankinaho, "Electrical Tuning of Integrated Mobile Phone Antennas," Nokia Mobile Phones, pp. 69–97 (Sep. 15, 1999).

P.K. Panayi, M. Al–Nuaimi, and L. P. Ivrissimtzis, "Tuning Techniques for the Planar Inverted–F Antenna," National Conference on Antennas and Propagation Publication, No. 461, pp. 259–262 (Apr. 1999).

Satoshi Makioka, et al., "A High Efficiency GaAs MCM Power Amplifier for 1.9 GHz Digital Cordless Telephones," IEEE 1994 Microwave and Millimeter–Wave Monolithic Circuits Symposium, pp. 51–54 (1994).

V. K. Varadan, K. A. Jose, V. V. Varadan, "Design and Development of Electronically Tunable Microstrip Antennas," IOP Publishing Ltd., pp. 238–242 (1999).

Communication Relating to the Results of the Partial Internatioal Search: PCT/IB 02/01077 (2002).

International Search Report: PCT/IB 02/01086 (Jun. 24, 2002).

International Search Report: PCT/IB 02/01078 (Jul. 10, 2002).

International Search Report: PCT/IB 02/01087 (Jul. 19, 2002).

International Search Report: PCT/IB 02/01107 (Jul. 11, 2002).

International Search Report: PCT/IB 02/01120 (Jul. 11, 2002).

International Search Report: PCT/IB 02/01098 (Jul. 4, 2002).

International Search Report: PCT/IB 02/0101082 (Jul. 8, 2002).

International Search Report: PCT/IB 02/01144 (Jul. 12, 2002).

International Search Report: PCT/IB 02/01026 (Jun. 28, 2002).

International Search Report: PCT/IB 02/01027 (Jun. 25, 2002).

* cited by examiner

TUNABLE PLANAR CAPACITOR

RELATED APPLICATIONS

This application claims the benefit of U.S. Provisional Application No. 60/283,093, filed Apr. 11, 2001, which is hereby incorporated by reference. In addition, this application relates to U.S. application Ser. No. 09/904,631, "Tunable Ferro-Electric Filter," filed on Jul. 13, 2001; Ser. No. 09/912,753, "Tunable Ferro-Electric Multiplexer," filed on Jul. 24, 2001; Ser. No. 09/927,732, "Low Loss Tunable Ferro-electric Device and Method of Characterization," filed on Aug. 8, 2001; and Ser. No. 09/927,136, "Tunable Matching Circuit," filed on Aug. 10, 2001, which are hereby incorporated by reference.

BACKGROUND

DESCRIPTION OF RELATED ART

Capacitors are commonly used in filters for wireless communication. Capacitors with capacitances in the range of 0.5 to 10.0 pF are typically employed in radio frequency signal paths to set resonant frequencies of filters to specific values. Additionally, capacitors are typically employed in matching circuits to match impedances between components in wireless communication devices. A capacitor, in fact, is a fundamental component in electrical circuit design. As is well known in the art, capacitors can be found in many circuits throughout electronic industries and wherever electronic circuits are required.

Referring specifically to filters for use in wireless communication devices, related application Ser. No. 09/904,631, discloses a tunable capacitor that has been developed for tuning the resonant frequency of a filter for use at different frequencies. Tunability can be achieved by applying a variable bias electric field to a ferro-electric (FE) material located in the field induced by the capacitor. FE materials have a dielectric constant that varies with the bias electric field. As the dielectric constant varies, the capacitance of the capacitor varies. This changes the resonant frequency of the filter.

As disclosed in patent application Ser. No. 09/904,631, there are three basic types of capacitors in common use: gap capacitors, overlay capacitors and interdigital capacitors. Gap capacitors and interdigital capacitors are both planar structures. That is, both electrodes of the capacitors are in the same plane. Overlay capacitors have electrodes that are in different planes, that is, planes that overlay each other. Typically, overlay capacitors can develop higher capacitances, but they are harder to fabricate than planar capacitors. Thus, this invention is focused on improving the biasing scheme for planar capacitors. The discussion below is directed to gap capacitors, but it will be understood that the methods and devices described herein apply equally to all planar capacitors.

It has proven difficult to apply the variable electric field to the FE material in RF applications without introducing (1) increased loss, (2) circuit complexity or (3) circuit size, or a combination of these three. The variable electric field is applied by applying a variable DC voltage to the FE material. Typically, in a planar capacitor, FE material is placed between the electrodes of the capacitor and the substrate. Thus, the FE layer is formed on the substrate. The capacitor electrodes are formed on the FE layer, with a gap between the electrodes, forming the capacitor.

One way of applying the DC voltage is to connect the DC voltage source to an electrode of the capacitor through a resistor. Often, a DC blocking capacitor must be used in the RF signal path so as to provide an RF ground for example, to the FE capacitor without shorting out the DC bias applied. The DC blocking capacitor invariably introduces added loss into the RF signal. This increased loss results in a lower signal to noise ratio for receive applications, which results in dropped communications, and increased power consumption in transmit applications, among other things. Additionally, the resistor and the DC blocking capacitor add to the cost, size and complexity of the device that the capacitor is used in. Thus, this method of applying the variable DC electric filed to the FE material is not an optimal solution.

While planar FE capacitors are relatively simple to fabricate, they require a larger DC bias voltage to tune, as the gap dimensions are necessarily large (typically greater than or equal to 2.0 microns) due to conventional patterning constraints. Overlay FE capacitors, alternatively, can be tuned with a minimum DC voltage, as the plate separation can be made quite small (about 0.1 micron FE film thickness is possible and greater than about 0.25 microns is typical). Thus, the required DC bias field strength can be a factor of 20 to 40 times smaller for an overlay capacitor than for a gap capacitor. Furthermore, most all of the DC bias field is constrained within the FE film in an overlay capacitor. This is not true in a gap or interdigital capacitor, where a significant portion of the DC bias field is located outside of the FE film.

One significant problem with overlay capacitors is that they are more difficult to fabricate than gap capacitors, as they are multi-layer structures. They typically need a common bottom electrode on which the desired FE thin film is deposited. Ideally the desired metals for the bottom electrodes are typically the low loss noble metals like gold, silver or preferably copper. The deposition requirements for most FE films, however, would cause the unacceptable formation of metal oxides. To prevent unwanted oxidation, the deposition of a high refractory metal, such as platinum as a cap, or covering, layer is needed, which adds an extra mask or layer as well as increases cost. Additionally, the bottom layer metal thickness should be increased to greater than about 2.0 skin depths, to minimize the metal loss in the bottom electrode.

Rather than relying on overlay capacitors, a compromise solution is to introduce a pair of bias electrodes into the vicinity of the gap of a planar capacitor. One version would pattern one bias electrode in the gap itself and place the other electrode between the substrate and the FE layer. The variable DC electric field is applied to the FE material by putting bias electrodes in the form of doped silicon on both sides of the FE material. Thus, a first doped silicon layer is formed on the substrate. A FE layer is formed on the first doped silicon layer. The capacitor electrodes are formed on the FE layer. A second doped silicon layer is formed inside the gap region of the capacitor. The bias voltage is applied to the second doped silicon layer and the first doped silicon layer is grounded, or vice versa. This approach is not preferred, as it requires the presence of two bias electrodes, one above and one below the FE layer as well as the presence of a bias electrode between the two RF electrodes in the gap capacitor.

Further, the gap typically must be widened to make room for the bias electrode between the two RF (capacitor) electrodes. Widening the gap reduces the capacitance of the structure. To bring the capacitance back to a useful level, the capacitor must be made wider. This increases the size and cost of the capacitor. Additionally, it is difficult and costly to manufacture a gap capacitor with a conducting layer of doped silicon in the gap, since one must provide added grounding as well as bias for a two layer bias scheme.

Accordingly, it would be beneficial to have a tunable FE capacitor with a less complex, cheaper and smaller bias scheme for applying the variable DC electric field to the FE material in a planar tunable capacitor.

SUMMARY

Variable capacitors using a variable DC voltage to tune the capacitance typically employ costly and overly large components to apply the variable DC voltage to the capacitor. Furthermore, at least one method of applying the variable DC voltage in the prior art introduces added signal loss into the RF signal path due to the need for a DC blocking capacitor.

Thus, it is an object of the present invention to provide methods and devices for applying a variable DC voltage to a tunable capacitor which introduce lower loss, lower cost and are smaller than those methods and devices previously available.

A bias electrode is positioned near a FE material. The capacitor electrodes are also positioned near the FE material, such that the capacitor electrodes and the bias electrode are not touching. There are only non-conductive materials, including possibly air, in the gap formed between the capacitor electrodes. The bias electrode is used to apply a variable DC voltage to the FE material. In a wide range of useful instances, one or both capacitor electrodes serve as a DC ground for producing a variable DC field between the bias electrode and the capacitor electrodes, thus eliminating the need for the extra DC blocking capacitor. Alternatively, one of the capacitor electrodes can be biased to, among other reasons, provide a modified capacitive response in that electrode. In other words, a single bias underlay electrode is added to a planar capacitor to achieve the biasing of the FE material. This allows for the elimination of biasing from either capacitor electrode. Alternatively, if bias is retained at either capacitor electrode, the underlay bias electrode allows for further biasing schemes.

DETAILED DESCRIPTION

A tunable gap capacitor is formed on a substrate. A bias electrode is positioned between the substrate and the capacitor electrodes. Only non-conductive material is in the gap between the capacitor electrodes. Between the bias electrode and the capacitor electrodes is a FE material for tuning the capacitance of the capacitor.

In other words, only one bias electrode is introduced, as an underlay, beneath the FE film layer deposited on the base substrate. In this configuration, the RF electrodes provide the DC return paths for the DC bias signal. In this realization there is no need for an external DC blocking capacitor as the DC bias introduced in this manner is inherently isolated from the rest of the circuit. A further advantage of this arrangement is that one need not increase the gap in the gap capacitor to accommodate the presence of a two layer bias electrode structure. Thus the most compact gap capacitor realization can be obtained in this manner.

Figure 1:
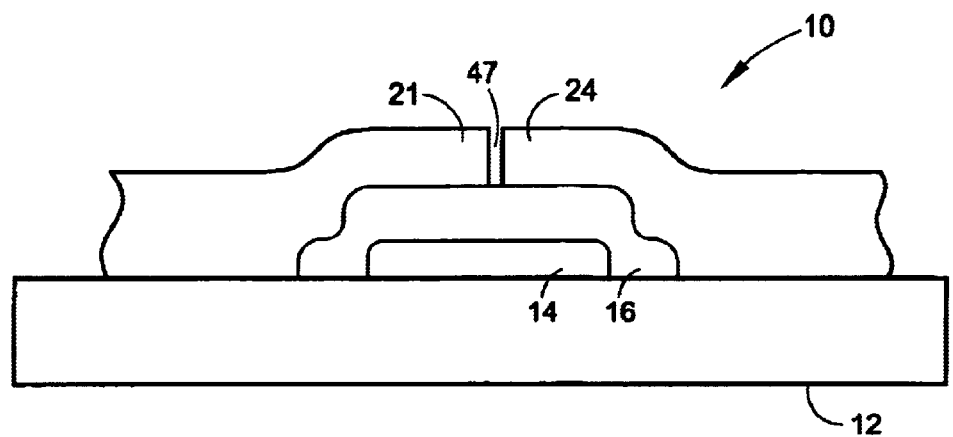
FIG. 1 is a side view of a tunable ferro-electric gap capacitor.

The gap capacitor will now be described with reference to FIG. 1. FIG. 1 is a side view of a tunable FE capacitor 10. A substrate 12 is shown. The substrate 12 is typically a low loss ceramic material such as magnesium oxide, sapphire, or some other such similar material on which the desired FE film can be deposited, preferably without the need for an adhesion or buffer layer. The substrate can also be a more lossy material like silicon dioxide, alumina or a printed circuit board material such as the well known material, FR4 as long as one can tolerate the added loss arising from its use, along with the added cost and complexity of using one or more buffer layers or an adhesion layer that may be necessary with these substrates.

Formed on the substrate 12 is a bias electrode 14. The bias electrode 14 is preferably doped silicon, as it can have a much lower conductivity than any metal, and its conductivity can be controlled by doping. Alternatively, the bias electrode 14 can be a metal such as gold, silver, platinum or copper. Over the bias electrode 14 is a FE layer 16. The FE layer 16 provides the tunability to the capacitor. Over the FE layer 16 are the capacitor electrodes 21 and 24. The capacitor is part of a RF signal path. The capacitor electrodes 21 and 24 define a space between the electrodes called a gap 47. The gap 47 is defined by the electrodes. The gap 47 is shown as a dotted line. The dotted line is separated somewhat from the solid line defining the capacitor electrodes 21 and 24. This is for the sake of distinguishing between the lines defining the gap 47 and the electrodes 21 and 24, not to indicate that there is any space between the gap 47 and the electrodes 21 and 24. The gap 47 and the electrodes 21 and 24 are coterminous.

Figure 2A:
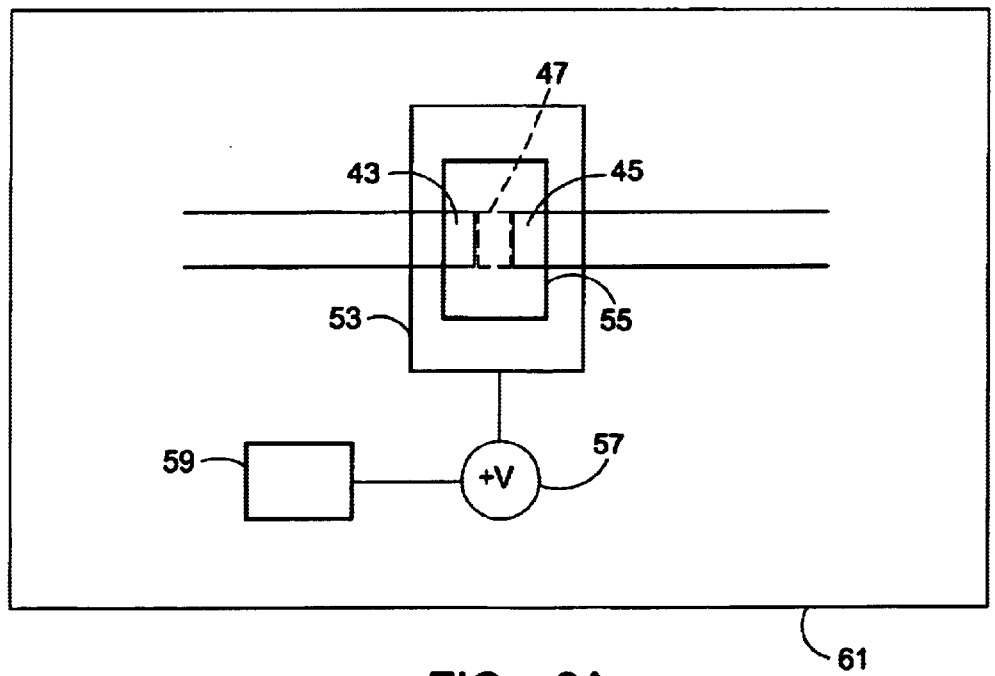
FIG. 2A is a top view of a tunable ferro-electric gap capacitor.

The gap capacitor will now be described with reference to FIG. 2A. FIG. 2A is a top view of the gap capacitor. A first capacitor electrode 43 and a second capacitor electrode 45 form a capacitor gap 47. In one implementation, the second electrode 45 is positioned within 3.0 microns of the first electrode 43. A ferro-electric material 53 lies preferably underneath the first and second capacitor electrodes 43 and 45. The ferro-electric material 53 could alternatively lie over the top of the first and second capacitor electrodes 43 and 45 assuming the proper precautions are taken to prevent the oxidation or melting of the metal traces 43 and 45 during the deposition of the FE film on top of the electrodes. Due to these limitations, the FE film will almost always be under the RF metal contacts, 43 and 45. In one implementation, the FE material 53 comprises barium strontium titanate and is formed in a layer having a thickness equal to about one micron.

A bias electrode 55 lies preferably underneath the ferro-electric material 53. The bias electrode 55 is preferably more narrow than the ferro-electric material 53, so that the bias electrode 55 does not make electrical contact with the first or second capacitor electrodes 43 and 45.

In some cases, it may be desirable to have a bias electrode of sufficient size and electrical thickness relative to the gap region that some noticeable capacitance exists between the capacitor electrodes and the bias electrode. An example of this is in the case where the bias electrodes extends underneath the capacitor electrodes as shown in FIG. 1. In this case, the electrical equivalent circuit is shown in FIG. 2B.

Figure 2B:
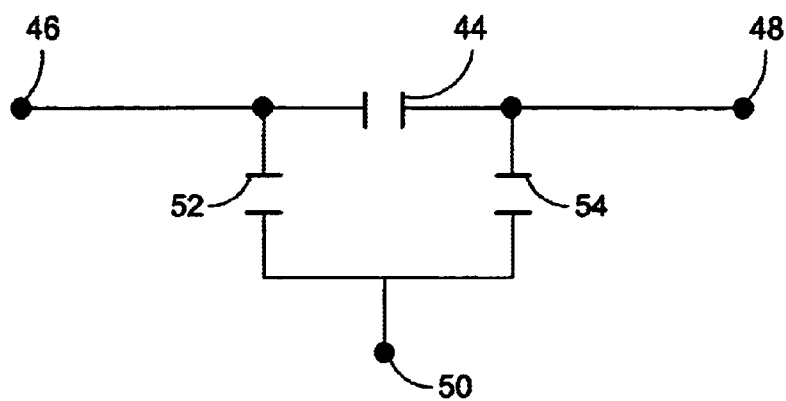
FIG. 2B is a circuit diagram equivalent of the tunable ferro-electric gap capacitor shown in FIG. 2A.

In FIG. 2B, a capacitor 44 is shown coupled between two terminals 46 and 48. The capacitor 44 represents the capacitance developed between the capacitor terminals 43 and 45 of FIG. 2A. The terminals 46 and 48 represent the capacitor electrodes 43 and 45 shown in FIG. 2A. A third terminal 50 represents the bias electrode 55 shown in FIG. 2A. Two other capacitors 52 and 54 are shown coupled between the terminals 46 and 48 and the third terminal 50. The other capacitors 52 and 54 represent capacitances developed between the capacitor electrodes 43 and 45 shown in FIG. 2A and the bias electrode 55 shown in FIG. 2A.

Depending on geometry and the materials used, the capacitances of capacitors 52 and 54 may be negligible, or not, when zero volts is applied to the bias electrode 55. Also, capacitors 52 and 54 may have some non-negligible tuning characteristics, as the bias voltage applied to bias electrode 55 is varied.

Additionally, a voltage may be applied to either terminal 46 or 48, in addition to the voltage applied to terminal 50. This further modifies the tuning characteristics of the complete device shown in FIG. 2B. In other words, there are two voltage differences that can be manipulated. The two differences are (1) between terminal 46 and terminal 50 and (2) between terminal 48 and terminal 50. By varying the geometries and electrode materials different tuning characteristics can be achieved without changing FE materials and thicknesses. One drawback of the embodiment employing a bias voltage at either terminal 46 or 48 is, as already stated, that a DC blocking capacitor is then required. A DC blocking capacitor increases RF loss.

Figure 3:
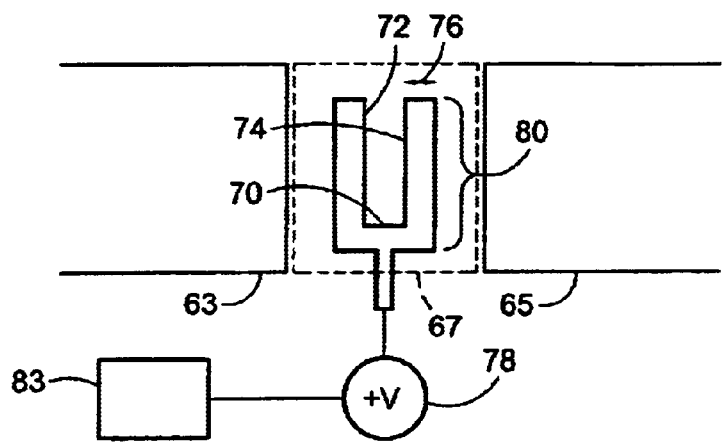
FIG. 3 is a top view of a tunable ferro-electric gap capacitor, having a finger-like bias electrode.

The bias electrodes need not be rectangular, as shown in FIG. 2. Preferably, the bias electrode has more than one finger as shown in FIG. 3. Alternatively, the bias electrode may have a portion removed from its center, a shown in FIG. 4. These shapes further reduce the loss introduced by the bias electrode by reducing any RF coupling to the bias electrode.

A preferred bias electrode shape will now be described with reference to FIG. 3. There are two capacitor electrodes 63 and 65 defining a gap 67. The bias electrode 80 is split into two fingers 72 and 74. A finger is defined herein as a strip thinner than the whole object. Here it is used to mean a strip of bias electrode material thinner than the whole bias electrode. This limits the RF current that can flow in the bias electrode 70, thereby reducing the loss in the bias electrode 70. Alternatively, the bias electrode 70 may have more than two fingers (only two fingers 72 and 74 shown). Preferably, the finger width 76 is about 1 to 2 microns.

A joining member 70 connects the fingers. In another embodiment, not shown, the joining member 70 is not inside the gap 67. The figners 72 and 74 are longer and the joining member 70 is outside the gap 67 on the side where the voltage is applied. It will be understood that many variations of this shape are possible.

The bias electrode 70 is adapted to be coupled to a voltage source 78 which is coupled to a control signal generator 83. Note that the ferro-electric layer is not shown, to more clearly show the other items described.

Figure 4:
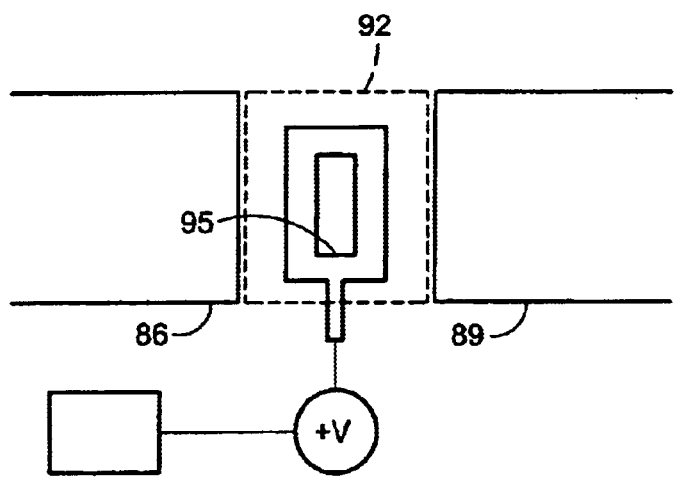
FIG. 4 is a top view of a tunable ferro-electric gap capacitor, having a center portion of a bias electrode missing.

Another bias electrode shape will now be described with reference to FIG. 4. Again, there are two capacitor electrodes 86 and 89 defining a gap 92. The bias electrode 95 is similar in shape to the bias electrode 70 described with reference to FIG. 3. The bias electrode 95, however, has its fingers connected at the ends. In other words, the bias electrode 95 is like a rectangular bias electrode, but with its center missing. Note that the shapes of bias electrodes described with reference to FIGS. 2A, 3 and 4 are simply by way of example. Other shapes, such as those having rounded corners, and asymmetrical shapes, would be within the spirit of the invention.

A variable DC voltage source 57 is coupled to the bias electrode 53 for applying a variable DC voltage to the bias electrode. Note that DC is intended to mean slowly varying with respect to a RF signal. The voltage on the capacitor electrodes will have some DC component. The DC component may be zero. The difference between the variable DC voltage applied to the bias electrode 53 and the DC component of the voltage in the capacitor electrodes 43 and 45 creates a DC electric field in the FE material 53. The variable DC voltage applied to the bias electrode 55 can be varied to change the dielectric constant of the FE material 53. This changes the capacitance of the capacitor. This changes the operating parameters of the device incorporating the capacitor, such as, for example, a filter or a matching circuit.

A control signal generator 59 is coupled to the voltage source 57 for controlling the voltage source 57. The capacitor electrodes 43 and 45, the bias electrode 55 and the ferro-electric material 53 are all located on a substrate 61. The control signal generator 59 and the voltage source 57 may be located on the substrate 61 (as shown) or off the substrate 61 (not as shown).

The bias electrode 55 is electrically thin, preferably less than about 0.01 microns so that it is less than about 0.1 skin depths. The added RF loss arising from the presence of the bias electrode is minimal and its effect is offset by the advantage gained in fabrication and improved tuning. In one implementation, the RF signal has a frequency equal to about 2.0 GHz, and the bias electrode 55 causes a field attenuation of about 0.28 percent in the RF signal.

The capacitor may be a tuning capacitor for use in a transceiver in a wireless communication device Preferably, the capacitor tunes a multiplexer or other filter-type device as described in U.S. patent application "Tunable Ferro-electric Multiplexer." The method of tuning the capacitor as described herein advantageously eliminates the need for a DC blocking capacitor and optionally eliminates the need for a DC bias resistor.

Alternatively, the capacitor may be used in conjunction with, or as part of, a tunable matching circuit as described in U.S. patent application, "Tunable Matching Circuit." Again, a DC blocking capacitor and a DC resistor may be eliminated.

It will be apparent to one of ordinary skill in the art that the tunable capacitor can be used in many other electronic circuits. Such uses are within the scope of the invention.

I claim:

1. A tunable planar capacitor comprising a substrate; a bias electrode formed on the substrate; a ferro-electric layer formed over the bias electrode; and capacitor electrodes formed over the ferro-electric layer that are spaced to define a gap, wherein:

the bias electrode is more narrow than the ferro-electric layer.

2. A capacitor as claimed in claim 1, wherein the bias electrode has a shape that limits RF current that can flow in the bias electrode and thereby reduces loss in the bias electrode.

3. A capacitor as claimed in claim 2, wherein the bias electrode comprises two fingers connected at one end by a joining member.

4. A capacitor as claimed in claim 3, wherein the two fingers are also connected at an opposite end to define a rectangular bias electrode.

5. A capacitor as claimed in claim 3, wherein the fingers have a width of about one to two microns.

6. A tunable planar capacitor comprising a substrate; a bias electrode formed on the substrate; a ferro-electric layer formed over the bias electrode; and capacitor electrodes formed over the ferro-electric layer that are spaced to define a gap, wherein:

the bias electrode is formed with sufficient size and electrical thickness relative to the gap such that a capacitance exists between the capacitor electrodes and the bias electrodes.

7. A capacitor as claimed in claim 6, wherein the capacitance between the capacitor electrodes and the bias electrodes has non-negligible tuning characteristics.

8. A capacitor as claimed in claim 6, wherein the bias electrode has a thickness of less than about 0.01 microns.

9. A tunable capacitor as claimed in claim 6, wherein the bias electrode has a thickness of less than about 0.1 skin depths.

* * * * *